US012266562B2

(12) United States Patent
Naito et al.

(10) Patent No.: US 12,266,562 B2
(45) Date of Patent: Apr. 1, 2025

(54) SUBSTRATE PROCESSING METHOD AND SUBSTRATE PROCESSING APPARATUS

(71) Applicant: Tokyo Electron Limited, Tokyo (JP)

(72) Inventors: Hajime Naito, Nirasaki (JP); Hidenori Miyoshi, Nirasaki (JP); Shigeki Doba, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 714 days.

(21) Appl. No.: 17/450,209

(22) Filed: Oct. 7, 2021

(65) Prior Publication Data

US 2022/0108913 A1 Apr. 7, 2022

(30) Foreign Application Priority Data

Oct. 7, 2020 (JP) .................. 2020-170068

(51) Int. Cl.
*H01J 37/32* (2006.01)
*H01L 21/677* (2006.01)
*H01L 21/687* (2006.01)

(52) U.S. Cl.
CPC .. *H01L 21/68757* (2013.01); *H01J 37/32715* (2013.01); *H01L 21/67739* (2013.01);
(Continued)

(58) Field of Classification Search
CPC ....... H01J 2237/20235; H01J 2237/332; H01J 37/32715; H01L 21/6875; H01L 21/68757; H01L 21/67739; H01L 21/68742; H01L 21/67069; H01L 21/31116; H01L 21/32137
USPC ................... 204/192.12, 298.15; 216/67, 71; 118/728; 427/569, 573; 156/345.51, 156/345.54
See application file for complete search history.

(56) References Cited

U.S. PATENT DOCUMENTS

2007/0160507 A1* 7/2007 Satoh .................. C23C 16/4586
422/135
2010/0214712 A1 8/2010 Yamawaku et al.
(Continued)

FOREIGN PATENT DOCUMENTS

CN 110809817 A 2/2020
CN 111326470 A * 6/2020
(Continued)

OTHER PUBLICATIONS

Machine Translation of JP 10-135186 (Year: 1998).*
Machine Translation CN-111326470 (Year: 2020).*

*Primary Examiner* — Rodney G McDonald
(74) *Attorney, Agent, or Firm* — Armstrong Teasdale LLP

(57) ABSTRACT

There is provided a method of processing a substrate using a substrate processing apparatus including: a processing container configured to process the substrate therein; a plasma generation space formed inside the processing container; a processing space in communication with the plasma generation space via a partition plate; a stage provided inside the processing space and configured to place the substrate on a top surface of the stage; and a lifting mechanism configured to raise and lower the substrate on the stage, the method including, during a plasma processing on the substrate in the processing space, raising and lowering the substrate using the lifting mechanism to cause a potential change in the substrate during the plasma processing.

17 Claims, 8 Drawing Sheets

(52) U.S. Cl.
CPC ............ *H01L 21/68742* (2013.01); *H01J 2237/20235* (2013.01); *H01J 2237/332* (2013.01)

(56) References Cited

U.S. PATENT DOCUMENTS

| | | |
|---|---|---|
| 2019/0185999 A1 | 6/2019 | Shanbhag et al. |
| 2021/0151326 A1 | 5/2021 | Shimizu et al. |

FOREIGN PATENT DOCUMENTS

| | | | |
|---|---|---|---|
| JP | 10135186 A * | 5/1998 | |
| JP | 2017-157778 A | 9/2017 | |
| KR | 10-2012-0073227 A | 7/2012 | |
| KR | 10-2020-0019983 A | 2/2020 | |
| KR | 10-2020-0090267 A | 7/2020 | |
| WO | WO-9704476 A2 * | 2/1997 | ........ H01J 37/32082 |

* cited by examiner

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2020-170068, filed on Oct. 7, 2020, the entire contents of which are incorporated herein by reference.

TECHNICAL FIELD

The present disclosure relates to a substrate processing method and a substrate processing apparatus.

BACKGROUND

Patent Document 1 discloses a substrate processing apparatus including a radio frequency (RF) power supply that supplies RF energy into a processing container, a gas source that introduces a gas into the processing container, a stage on which a substrate is placed, and a partition plate that partitions the interior of the processing container into a plasma generation space and a substrate processing space.

PRIOR ART DOCUMENT

Patent Document

Patent Document 1: Japanese Laid-Open Patent Publication No. 2017-157778

SUMMARY

According to one embodiment of the present disclosure, there is provided a method of processing a substrate using a substrate processing apparatus including: a processing container configured to process the substrate therein; a plasma generation space formed inside the processing container; a processing space in communication with the plasma generation space via a partition plate; a stage provided inside the processing space and configured to place the substrate on a top surface of the stage; and a lifting mechanism configured to raise and lower the substrate on the stage, the method including, during a plasma processing on the substrate in the processing space, raising and lowering the substrate using the lifting mechanism to cause a potential change in the substrate during the plasma processing.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
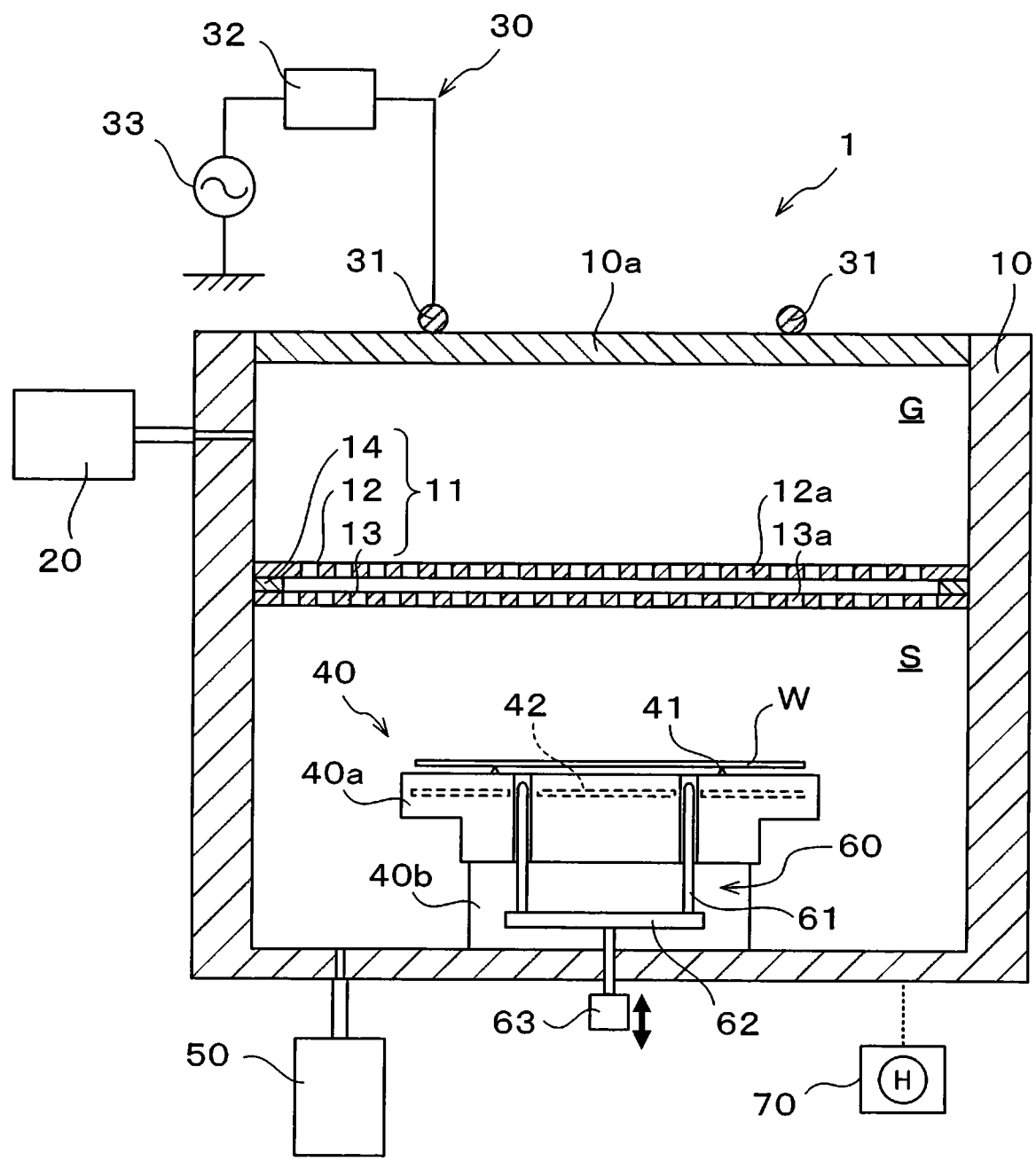
FIG. 1 is a vertical cross-sectional view illustrating an example of a configuration of a plasma processing apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device, a silicon-containing film is widely applied to various applications. For example, a Si-containing film, such as a silicon germanium (SiGe) film or a silicon (Si) film, is used for a gate electrode, a seed layer, or the like. Conventionally, in a process of manufacturing a gate-all-around (GAA) transistor, such as a nanosheet or a nanowire, plasma processing, such as etching, diffusion, or film formation, is performed on a semiconductor wafer (hereinafter, simply referred to as "wafer") as a substrate on which such a Si-containing film is formed.

The technique disclosed in Patent Document 1 described above is a method of etching a wafer on which a Si-containing film is formed. As described in Patent Document 1, the etching is performed through plasma processing in which a processing gas excited by plasma is supplied to the wafer disposed within a chamber.

In such a plasma processing for the wafer, there is concern about the occurrence of metal contamination on the rear surface of the wafer to be processed when the supply of radio frequency (RF) power for generating plasma is started (which may be referred to as "at the time of RF—ON" below). It is considered that the metal contamination on the rear surface of the wafer is caused since particles are generated by the reaction of a metal disposed inside the chamber, such as a stage on which the wafer is placed, with plasma, and the particles electrically adhere to the rear surface due to a change in wafer potential Vdc at the time of RF—ON.

Therefore, as a result of intensive studies made by the present inventors, it was found that, during plasma processing on the wafer to be processed, Vdc changes when lifting pins for delivering the wafer within the chamber is operated. That is, the present inventors newly found the possibility that particles adhering to the rear surface can be desorbed by changing the charged state of the wafer by operating the lifting pins. Such findings are not disclosed in Patent Document 1.

The technique according to the present disclosure has been made on the basis of such findings, and appropriately reduces metal contamination on the rear surface of a substrate in plasma processing. Hereinafter, a plasma processing apparatus as a substrate processing apparatus according to the present embodiment and a plasma processing method as a substrate processing method performed using the plasma processing apparatus will be described with reference to the drawings. In this specification and the drawings, elements having substantially the same functional configurations will be denoted by the same reference numerals and redundant descriptions will be omitted.

<Plasma Processing Apparatus>

FIG. 1 is a vertical cross-sectional view schematically illustrating an outline of a configuration of a plasma processing apparatus 1. In the plasma processing apparatus 1, arbitrary plasma processing, such as etching, diffusion, or film formation, is performed on the surface of a wafer W. In the following description, the surface of the wafer W to be subjected to the plasma processing will be referred to as a "front surface", and the surface of the wafer W located on the side opposite to the front surface and held by a stage 40 (to be described later) will be referred to as a "rear surface".

As illustrated in FIG. 1, the plasma processing apparatus 1 includes a processing container 10 having a hermetically sealed structure to accommodate the wafer W. The processing container 10 is made of, for example, aluminum or an aluminum alloy, and has an opened upper end, which is closed by a lid 10a serving as a ceiling. A loading/unloading port (not illustrated) through which the wafer W is transferred is provided in the side surface of the processing container 10. The processing container 10 is connected to the outside of the plasma processing apparatus 1 via the loading/unloading port. The loading/unloading port is configured to be openable/closable by a gate valve (not illustrated).

The interior of the processing container 10 is partitioned by a partition plate 11 into a plasma generation space G positioned the upper side and a processing space S positioned the lower side. That is, the plasma processing apparatus 1 according to the present embodiment is configured as a remote plasma processing apparatus in which the plasma generation space G is separated from the processing space S.

The partition plate 11 includes at least two plate-shaped members 12 and 13 arranged to overlap each other from the plasma generation space G toward the processing space S. A spacer 14 configured to adjust a gap between the plate-shaped members 12 and 13 is arranged between the plate-shaped members 12 and 13. Each of the plate-shaped members 12 and 13 has slits 12a or 13a formed therethrough in the overlapping direction. Respective slits 12a and 13a are arranged so as not to overlap each other in a plan view. Thus, the partition plate 11 functions as a so-called ion trap that suppresses the permeation of ions in the plasma into the processing space S when the plasma is generated in the plasma generation space G. More specifically, a slit arrangement structure in which the slits 12a and the slits 13a are arranged so as not to overlap each other, namely, a labyrinth structure, prevents the movement of anisotropically-moving ions while allowing isotropically-moving radicals to permeate therethrough.

In other words, by the partition plate 11 configured as above, the plasma generation space G and the processing space S are in communication with each other via the slits 12a and 13a. As a result, during plasma processing of the wafer W in the processing space S to be described later, a potential change (Vdc change) of the wafer W is generated by the operation of lifting pins 61 to be described later. The structure of the partition plate 11 is not limited to the illustrated example, and any configuration may be adopted as long as the Vdc change can be caused on the wafer W by the operation of the lifting pins 61 to be described later.

The plasma generation space G is provided with a gas supplier 20 configured to supply a processing gas into the processing container 10 and a plasma generator 30 configured to plasmarize the processing gas supplied into the processing container 10.

A plurality of gas sources (not illustrated) are connected to the gas supplier 20. The plurality of gas sources supply processing gases including a fluorine-containing gas (e.g., a $NF_3$ gas), an oxygen-containing gas (e.g., an $O_2$ gas), and a diluting gas (e.g., an Ar gas) into the processing container 10. In addition, the types of the fluorine-containing gas, the oxygen-containing gas, and the diluting gas are not limited thereto, and may be arbitrarily selected.

The gas supplier 20 is provided with a flow rate regulator (not illustrated) configured to regulate an amount of a processing gas supplied to the plasma generation space G. The flow rate regulator has, for example, an opening/closing valve and a mass flow controller.

The plasma generation part 30 is configured as an inductively coupled apparatus using an RF antenna. The lid 10a of the processing container 10 is formed of, for example, a quartz plate and is configured as a dielectric window. An RF antenna 31 configured to generate inductively coupled plasma in the plasma generation space G of the processing container 10 is provided above the lid 129. The RF antenna 31 is connected to an RF power supply 33 via a matcher 32.

The matcher 32 includes a reactance-variable matching circuit (not illustrated) for matching the impedance on the side of the RF power supply 33 with the impedance on the side of a load (the RF antenna 31 or plasma).

The RF power supply 33 outputs RF power having a constant frequency (usually, 13.56 MHz or higher) suitable for generating plasma through inductively coupled RF discharge at an arbitrary output value.

The processing space S is provided with the stage 40 on which the wafer W is placed inside the processing container 10 and an exhauster 50 configured to discharge the processing gas in the processing container 10.

The stage 40 includes an upper stage 40a having a placement surface (hereinafter, referred to as a "wafer placement surface") on which the wafer W is placed, on an upper surface thereof, and a lower stage 40b fixed to the bottom surface of the processing container 10 and configured to support the upper stage 40a from below. The stage 40 is made of a metal such as aluminum or an aluminum alloy.

Figure 2:
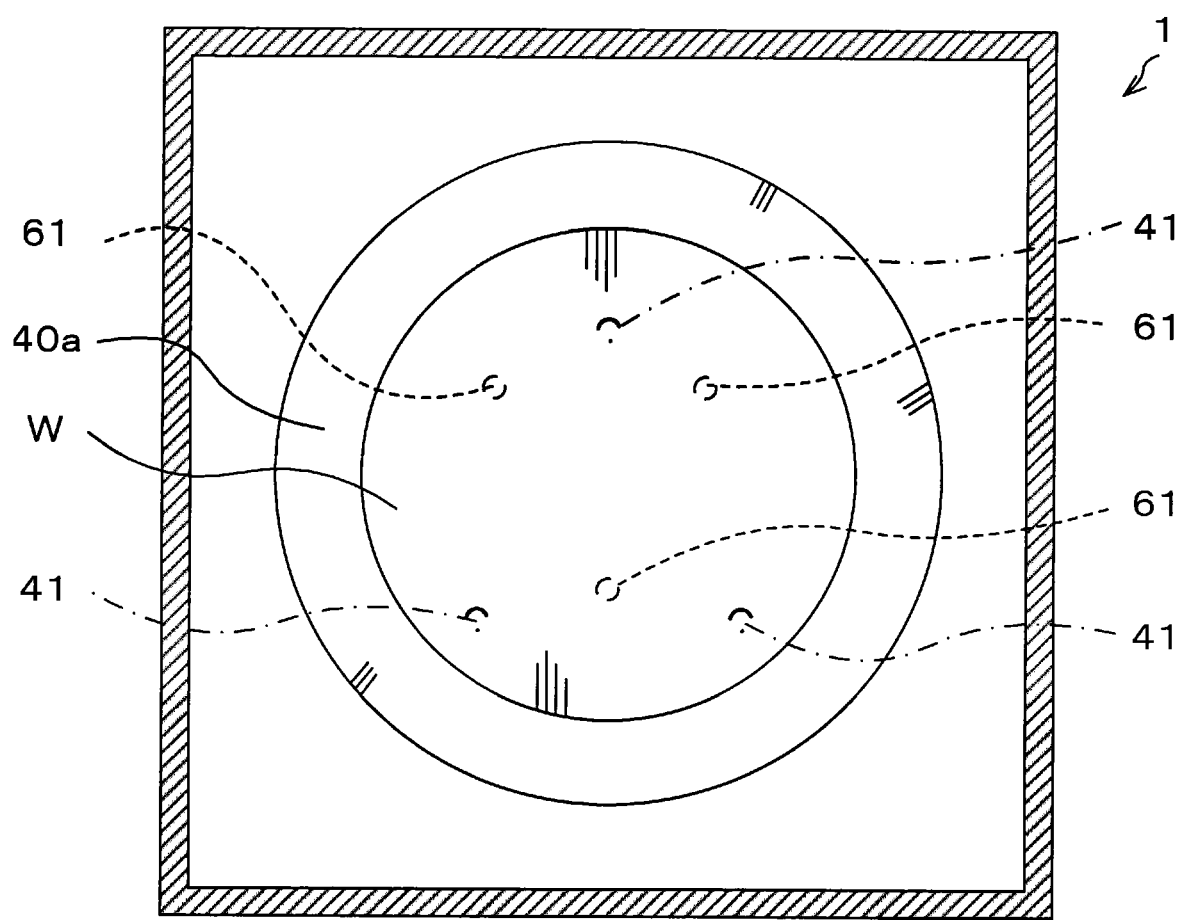
FIG. 2 is a horizontal cross-sectional view illustrating the example of the configuration of the plasma processing apparatus.

The wafer placement surface of the upper stage 40a is provided with a plurality of proxy pins 41 (e.g., three proxy pins 41 in the present embodiment) configured to hold the wafer W thereon. The wafer W placed on the stage 40 is held on the wafer placement surface in the state of being slightly lifted from the wafer placement surface via the proxy pins 41. As illustrated in FIG. 2, the proxy pins 41 are provided at equal intervals along the circumferential direction of the stage 40 (the wafer placement surface).

In addition, a temperature control mechanism 42 and a lifter 60 are provided inside the stage 40.

The temperature control mechanism 42 is provided inside the upper stage 40a and adjusts a temperature of the wafer W during plasma processing to a desired temperature. The temperature control mechanism 42 may include a heater, a flow path, or a combination thereof. A temperature control fluid, such as a coolant or a heat transfer gas, flows through the flow path.

The lifter 60 used as a lifting mechanism raises and lowers the wafer W on the stage 40. The lifter 60 includes lifting pins 61, a support member 62, and a drive part 63.

The lifting pins 61 are columnar members configured to move upward and downward such that upper end portions thereof are moved upward and downward with respect to the wafer placement surface, and are provided to penetrate the upper stage 40a in the thickness direction. As illustrated in FIG. 2, three or more lifting pins 61 are provided at intervals along the circumferential direction of the stage 40 (the wafer placement surface). The lifting pins 61 are provided, for example, at equal intervals along the circumferential direction.

The support member 62 is provided inside the lower stage 40b and supports the plurality of lifting pins 61. The drive part 63 raises and lowers the plurality of lifting pins 61 by generating a driving force for raising and lowering the support member 62. The drive part 63 includes a motor (not illustrated) that generates the drive force.

The lifter 60 is configured to raise and lower the lifting pins 61 via the support member 62 with the operation of the drive part 63 such that the lifting pins 61 are movable between a wafer delivery position (a position at which the upper ends protrude from the wafer placement surface) and a standby position (a position at which the upper ends do not protrude from the wafer placement surface). In other words, the lifter 60 is configured to move the wafer W held by the lifting pins 61 with the operation of the drive part 63 between a delivery position (a position at which the wafer W is delivered to and from the wafer transfer mechanism) and a processing position (a position at which the wafer W is placed on the wafer placement surface).

The arrangement and configuration of the lifter 60 are not limited to the illustrated example, and may be arbitrarily changed.

Outside the stage 40, the exhauster 50 is connected to an exhaust mechanism (not illustrated), such as a vacuum pump, via an exhaust pipe provided in the bottom portion of the processing container 10. The exhaust pipe is provided with an automatic pressure control valve (APC). An internal pressure of the processing container 10 is controlled by the exhaust mechanisms and the automatic pressure control valve.

The plasma processing apparatus 1 described above is provided with a control device 70 as a controller. The control device 70 is a computer including, for example, a CPU and memory, and includes a program storage part (not illustrated). The program storage part stores a program for controlling the processing of the wafer W in the plasma processing apparatus 1. The program storage part also stores a program for controlling the operations of the above-mentioned various components to implement the wafer processing (to be described later) in the plasma processing apparatus 1. The program may be recorded in a non-transitory computer-readable storage medium H, and may be installed on the control device 70 from the storage medium H.

<Plasma Processing>

Figure 3:
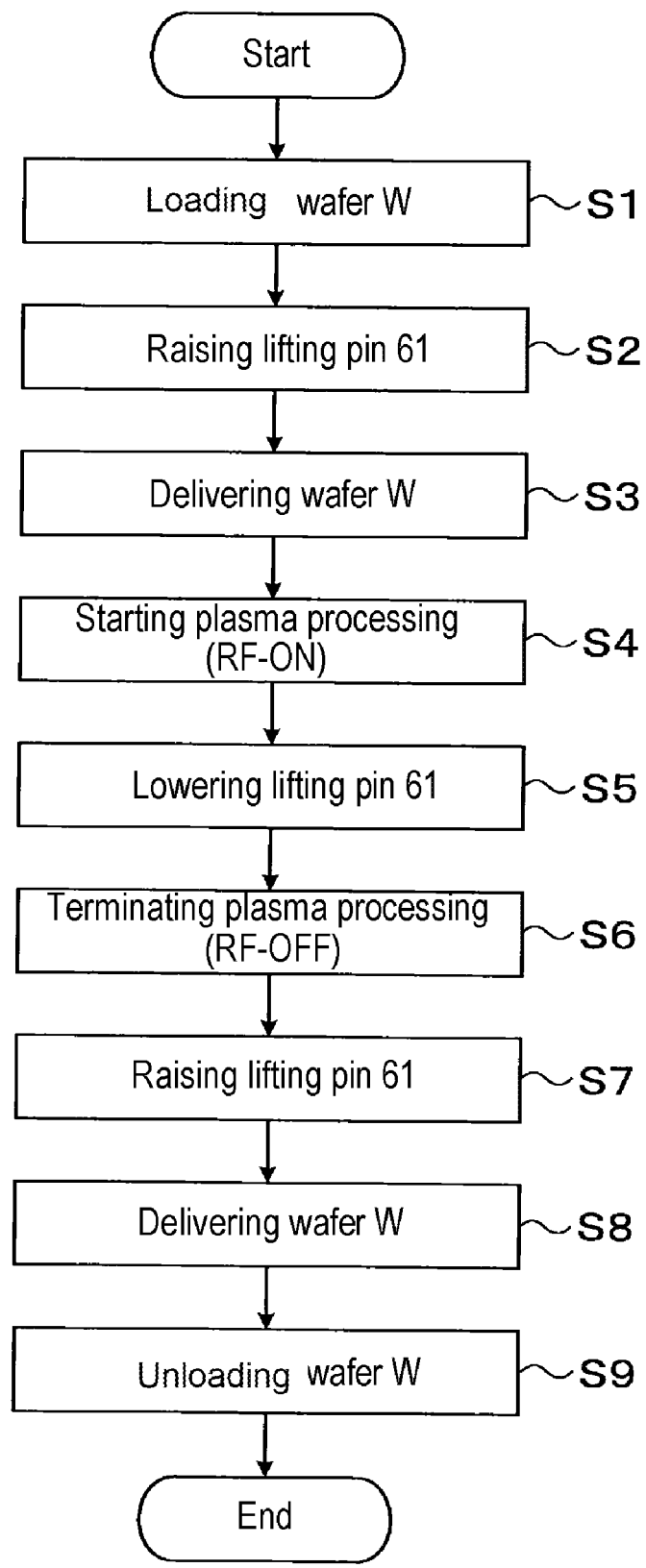
FIG. 3 is a flowchart illustrating main steps of wafer processing according to an embodiment.
Figure 4:
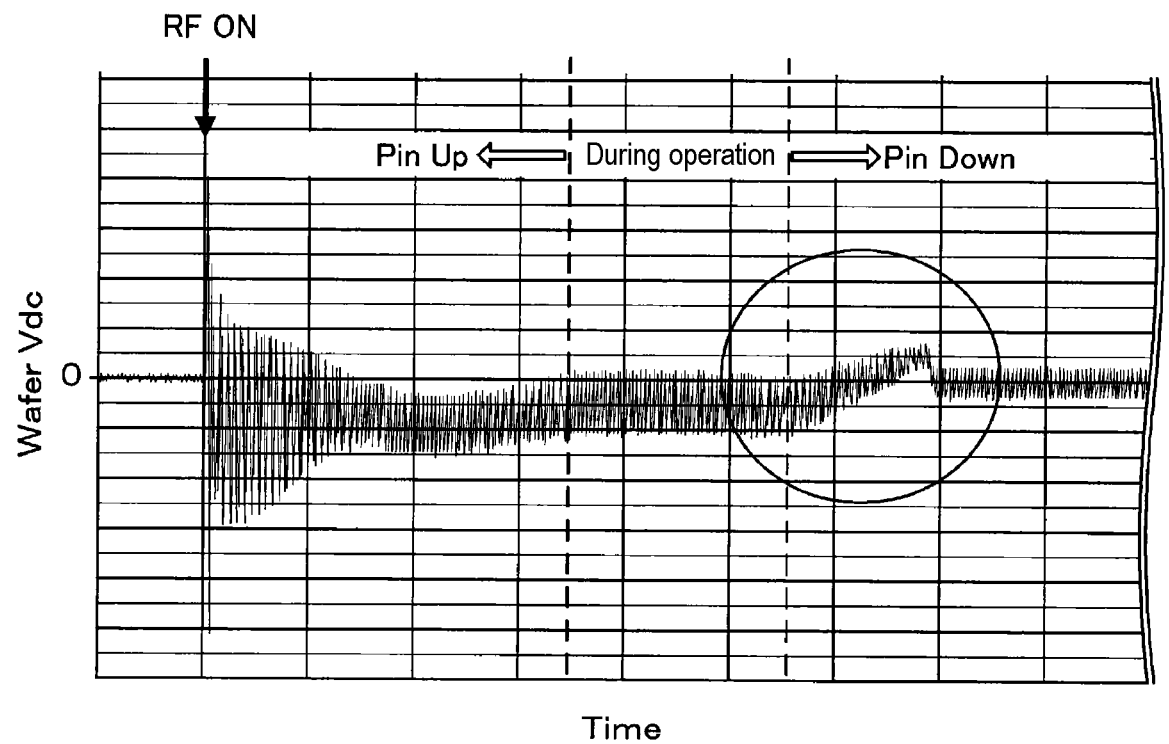
FIG. 4 is a graph showing an example of a Vdc change in a wafer in plasma processing according to the present embodiment.
Figure 4:
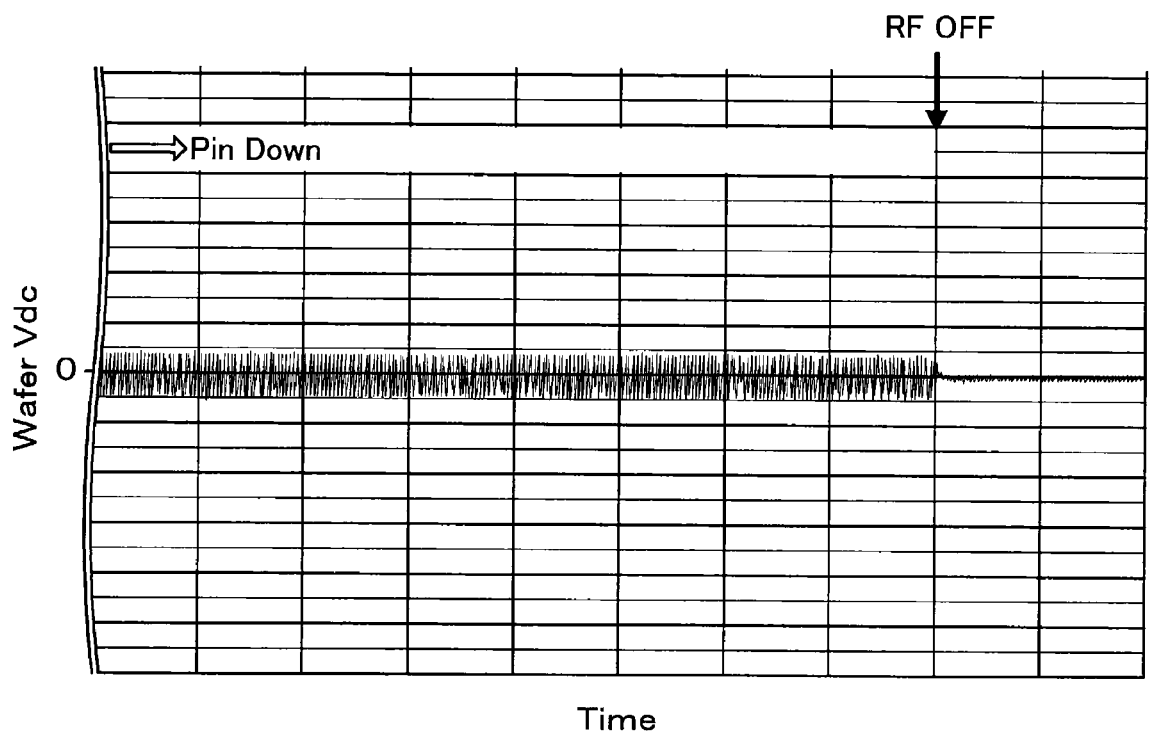

The plasma processing apparatus 1 according to the present embodiment is configured as described above. Next, plasma processing performed using the plasma processing apparatus 1 will be described. FIG. 3 is a flowchart illustrating main steps of the plasma processing according to the present embodiment. FIG. 4 is a graph showing an example of the potential change (Vdc change) of the wafer W due to the plasma processing. In the following description, a case in which a Si film formed on the front surface of the wafer W is etched will be described as an example, but the type of a Si-containing film formed on the front surface of the wafer W may be arbitrarily determined (e.g., a SiN film or a $SiO_2$ film). In addition, the plasma processing applied to the wafer W is not limited to the etching.

Figure 5:
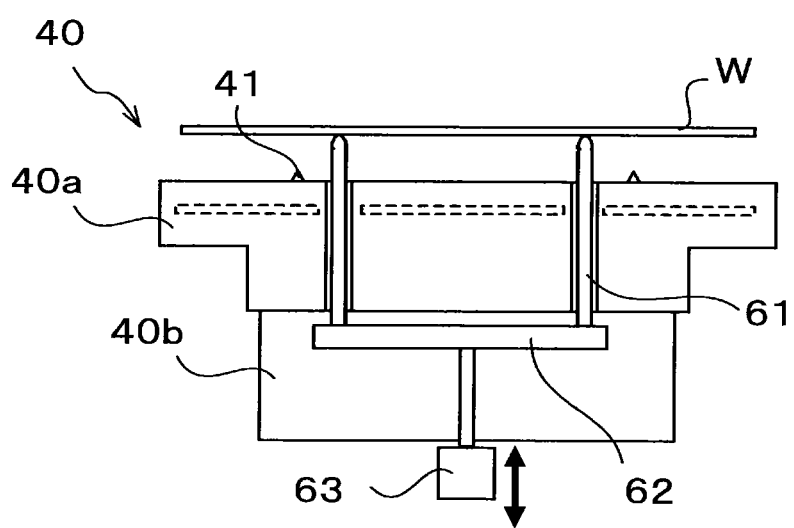
FIG. 5 is an explanatory view illustrating a state in which a wafer is held by lifting pins.

First, the wafer W to be processed is loaded into the processing space S inside the processing container 10 by a wafer transfer mechanism (not illustrated) provided outside the plasma processing apparatus 1 (step S1 in FIG. 3). When the wafer W is loaded into the processing space S, the lifting pins 61 are raised from the standby position to the delivery position with the operation of the drive part 63 (step S2 in FIG. 3), and the wafer W is delivered from the wafer transfer mechanism (not illustrated) to the lifting pins 61 (step S3 in FIG. 3). At the delivery position, as illustrated in FIG. 5, the rear surface of the wafer W is held on the upper ends of the lifting pins 61 in the state of being separated from the wafer placement surface (the proxy pins 41) of the stage 40 without being in contact with the wafer placement surface.

When the wafer W is delivered onto the lifting pins 61, the plasma processing on the wafer W begins (step S4 in FIG. 3). Specifically, the processing gases (the $NF_3$ gas, the $O_2$ gas, and the Ar gas in the present embodiment) are supplied from the gas supplier 20 to the plasma generation space G, and the RF power is supplied to the RF antenna 31 (RF—ON) to generate plasma that is inductively coupled plasma and contains oxygen and fluorine. In other words, the generated plasma contains fluorine radicals (F*) and oxygen radicals (O*).

When the plasma processing performed in the plasma processing apparatus 1 is, for example, etching the Si film formed on the wafer W as described above, the pressure (degree of vacuum) of the plasma generation space G is preferably 10 mTorr to 5 Torr, more preferably 25 mT to 800 mT. In addition, the temperature of the plasma generation space G is preferably 60 degrees C. to 120 degrees C., more preferably 100 degrees C. In addition, the flow rate ratio [sccm] of the processing gases is preferably $NF_3:O_2:Ar=3$ to 100:0 to 1,000:50 to 300.

Here, when the wafer W is disposed at the processing position at the start of the plasma processing, the rear surface of the wafer W and the stage 40 (the wafer placement surface) are disposed close to each other. Therefore, metal contamination may occur on the rear surface of the wafer W. More specifically, a Vdc change occurs in the wafer W due to the influence of a change in the magnetic field (electric field) in the plasma generation space G at the start of supply of RF power (at the time of RF—ON), which may cause metal particles P (which are mainly, for example, Cr, when the stage 40 is made of aluminum) on the wafer placement surface to be electrically adsorbed on the rear surface of the wafer W.

In this regard, in the present embodiment, the wafer W is disposed at the delivery position raised by the lifting pins 61 at the start of supply of RF power (at the time of RF—ON), and is physically separated from the wafer placement surface (the proxy pins 41) of the stage 40, as illustrated in FIG. 5. This makes it possible to appropriately reduce the electrical adhesion of particles to the rear surface of the wafer W compared with the case in which the supply of RF power is started in the state in which the wafer W is disposed at the processing position. In other words, the influence of the Vdc change in the wafer W on the particles on the wafer placement surface is suppressed, thereby reducing the adhesion of the particles to the rear surface.

The plasma generated in the plasma generation space G is supplied to the processing space S via the partition plate 11.

Here, since the partition plate 11 has a labyrinth structure formed as described above, only the radicals generated in the plasma generation space G permeate into the processing space S. Then, by causing the radicals supplied to the processing space S to act on the wafer W, the plasma processing proceeds on the wafer W. Since the plasma processing is started in the state in which the wafer W is separated from the wafer placement surface as described above, the Vdc value of the wafer W changes in a negative range in an initial stage of the plasma processing as illustrated in a "Pin-Up" region in FIG. 4.

When the plasma processing on the wafer W is started, the lifting pins 61 are lowered with the operation of the drive part 63. Therefore, the wafer W is lowered from the delivery position to the processing position (step S5 in FIG. 3). When the wafer W is placed on the wafer placement surface (the proxy pins 41) through the movement to the processing position, the Vdc value of the wafer W changes accordingly. Specifically, as illustrated in a "Pin-Down" region in FIG. 4, the Vdc value, which has changed in the negative range at the time of "Pin-Up", stably changes in the vicinity of the zero value after being changed to a positive value when the wafer W and the stage 40 are electrically connected to each other. In other words, with the operation of lowering the wafer W by the lifting pins 61, the charged state of the wafer W is changed before and after the lowering movement.

In the present embodiment, by lowering the wafer W using the lifting pins 61 to change the Vdc value during the plasma processing in this way, the charged state of the wafer W is changed. As a result, for example, even if particles have adhered to the rear surface of the wafer W at the start of the supply of RF power, the adhered particles can be separated from the rear surface by the change in the charged state.

The time for lowering the lifting pins 61 may be arbitrarily determined as long as it is between the start of the plasma processing on the wafer W (RF—ON) and the completion of the plasma processing (RF—OFF). However, when the wafer W is raised using the lifting pins 61, the temperature of the wafer W may not be appropriately controlled by the temperature control mechanism 42. From this point of view, it is preferable to shorten the time for raising the wafer W using the lifting pins 61. That is, it is preferable to move the wafer W to the processing position immediately after the start of the plasma processing on the wafer W (immediately after the start of the supply of RF power).

When the wafer W is moved to the processing position with the lowering of the lifting pins 61, the plasma processing on the wafer W is continued. At this time, as illustrated in the "Pin-Down" region in FIG. 4, the Vdc value of the wafer W changes in the vicinity of the zero value. Thereafter, when a desired plasma processing result is obtained for the wafer W, the supply of the processing gases to the plasma generation space G is stopped, the supply of RF power from the RF antenna 31 is stopped (RF—OFF), and the plasma processing in the plasma processing apparatus 1 is completed (step S6 in FIG. 3).

When the plasma processing on the wafer W is completed, the lifting pins 61 are raised with the operation of the drive part 63 to move the wafer W from the processing position to the delivery position (step S7 in FIG. 3). Then, after the wafer W is delivered from the lifting pins 61 to the wafer transfer mechanism (not illustrated) provided outside the plasma processing apparatus 1 (step S8 in FIG. 3), the wafer W is unloaded to the outside from the processing container 10 (step S9 in FIG. 3). When the wafer W is unloaded from the processing container 10, the lifting pins 61 are moved from the delivery position to the standby position with the operation of the drive part 53. In this way, a series of plasma processing steps in the plasma processing apparatus 1 are completed.

Actions and Effects of Wafer Processing According to Embodiment

According to the above-described embodiments, the processing space S in which the plasma processing on the wafer W is performed is provided to communicate with the plasma generation space G via the partition plate 11 in which slits are formed. This makes it possible to change the Vdc value in the wafer W by raising and lowering the wafer W using the lifting pins 61 at the time of the plasma processing in the processing space S. Then, since the charged state of the wafer W can be changed (reversed) according to a Vdc change in the wafer W, the particles, which have electrically adhered to the rear surface of the wafer W, can be appropriately separated. That is, metal contamination on the rear surface of the wafer W can be reduced.

In addition, by starting plasma processing, more specifically starting the supply of RF power in the state in which the wafer W and the wafer placement surface are electrically cut off by raising the lifting pins 61, it is possible to suppress the adhesion of particles on the wafer placement surface to the rear surface, and further to appropriately reduce the metal contamination on the rear surface.

Figure 6:
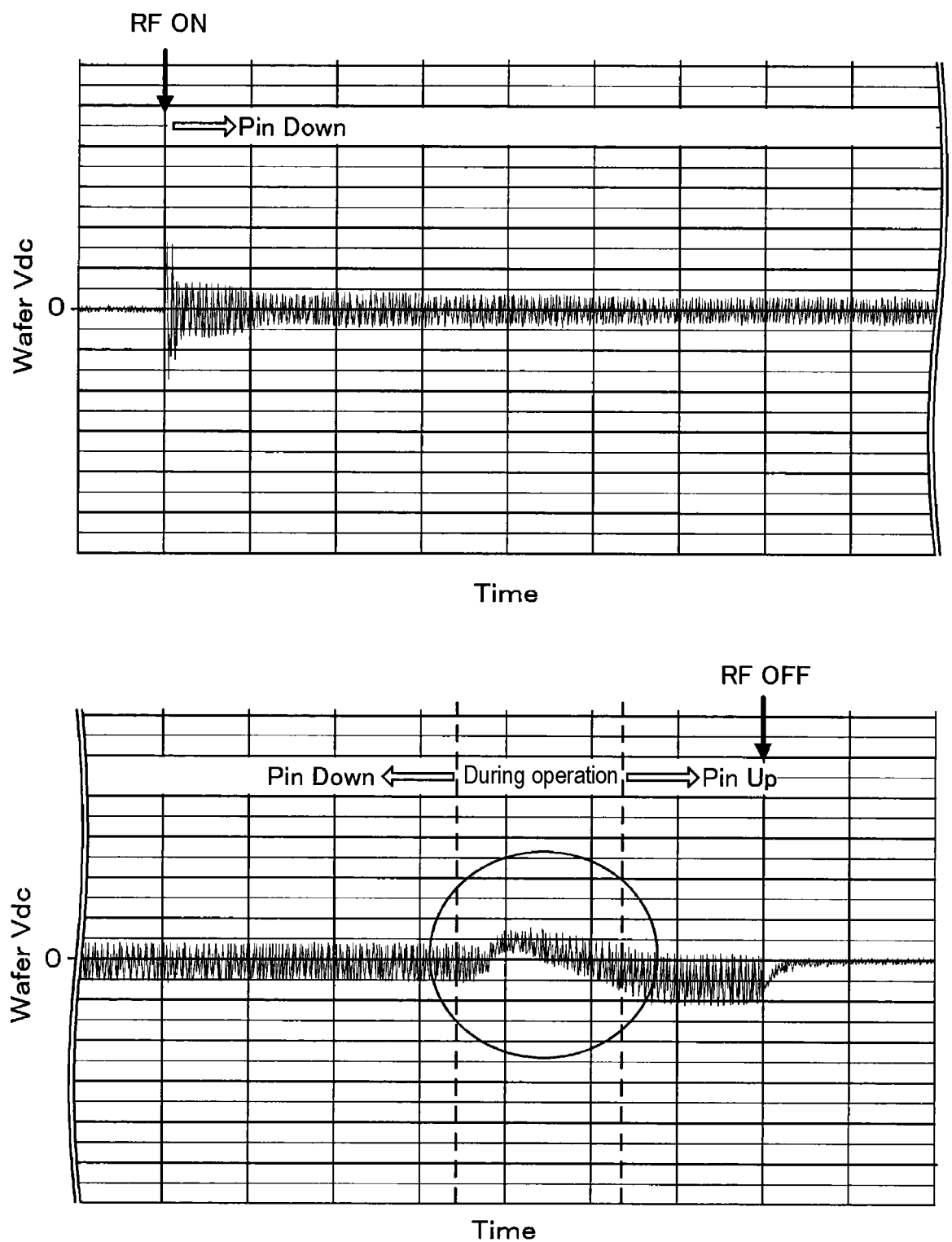
FIG. 6 is a graph showing an example of a Vdc change in a wafer in plasma processing according to another embodiment.

In the above-described embodiments, the plasma processing is started in the state in which the wafer W is disposed at the delivery position, and then the wafer W is moved (lowered) to the processing position during the plasma processing. However, the operation of the pins in the plasma processing is not limited thereto. For example, the plasma processing may be started in the state in which the wafer W is disposed at the processing position, and then the wafer W is moved (raised) to the delivery position during the plasma processing. FIG. 6 is a graph showing an example of a Vdc change during the plasma processing in this case.

As shown in FIG. 6, when the wafer W is moved (raised) from the processing position to the delivery position during the plasma processing, the Vdc value, which has changed stably in the vicinity of the zero value at the time of Pin-Down, fluctuates to a positive range as the wafer W and the stage 40 are separated from each other (electrically cut off), the Vdc value stably changes in a negative range. In other words, with the operation of raising the wafer W using the lifting pins 61, the charged state of the wafer W is changed before and after the raising movement.

As described above, when the plasma processing is started in the state in which the wafer W is placed at the processing position, particles may electrically adhere to the rear surface of the wafer W. However, by moving (raising) the wafer W from the processing position to the delivery position and changing the Vdc value during the plasma processing as described above, the charged state of the wafer W can be changed, which makes it possible to separate the particles, which have adhered to the rear surface, and appropriately reduce metal contamination on the rear surface of the wafer W. Further, since the rear surface of the wafer W at the delivery position is physically separated from the wafer placement surface of the stage 40, the adhesion of particles to the rear surface of the wafer W after being positioned at the delivery position is appropriately suppressed.

Figure 7:
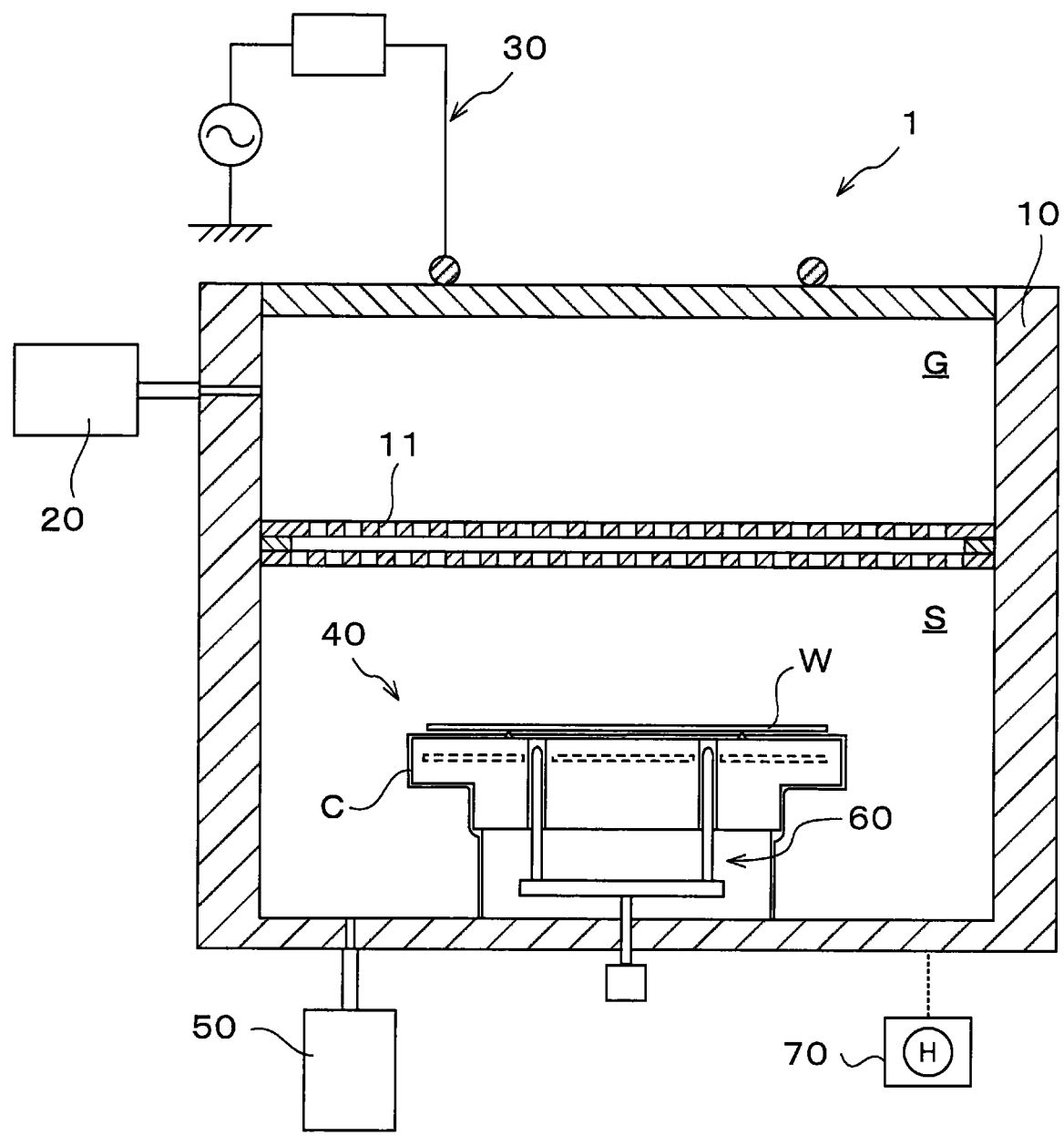
FIG. 7 is an explanatory view schematically illustrating another method of reducing metal contamination on a rear surface of a wafer.

As described above, the reason why the metal contamination on the rear surface of the wafer W occurs is considered to be that the radicals supplied to the processing space S react with a metal, such as aluminum that constitutes the stage 40, thereby generating particles, and the particles adhere on the rear surface of the wafer W. Therefore, as illustrated in FIG. 7, metal contamination on the rear surface of the wafer W may be reduced by suppressing the generation of particles in the plasma processing by forming a coating film C on the surface of a metal such as aluminum, which is a source of such particles, using a material that is at least superior in radical resistance to the metal. For example, when the metal is aluminum, yttrium fluoride ($YF_3$), yttrium oxyfluoride (YOF), Teflon (registered trademark), or the like may be selected as the coating material.

The thickness of the coating film C formed on the metal surface may be arbitrarily determined. However, from the viewpoint of stably forming the coating film C on the metal surface and inhibiting the formed coating film C from peeling off due to its own weight or the like, the thickness of the coating film C is preferably about 100 μm to 170 μm. When the coating film C is formed on the wafer placement surface of the stage 40, the thickness of the coating film C formed on the wafer placement surface is preferably at least smaller than the height of the proxy pins 41.

Figure 8:
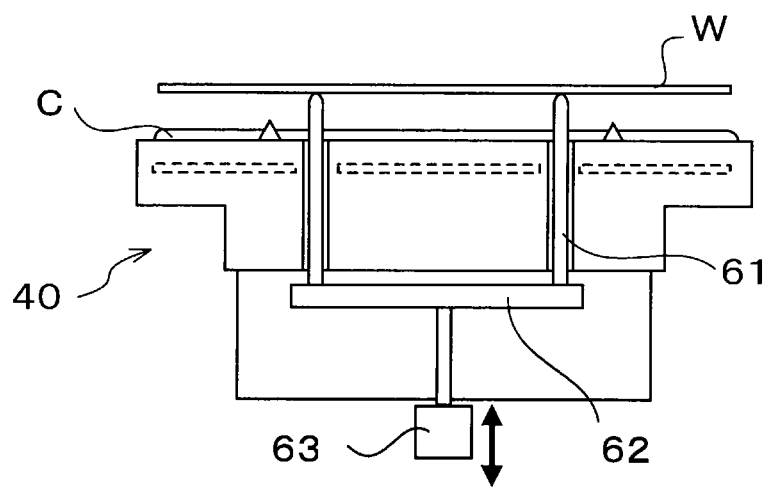
FIG. 8 is an explanatory view schematically illustrating an example in which a coating film is formed.

For example, when the coating film C is formed on the surface of the stage 40, the coating film may be formed on the entire surface (the top surface and side surface) of the stage 40, as illustrated in FIG. 7, and the coating film C may be at least formed only on the wafer placement surface of the upper stage 40a, as illustrated in FIG. 8. By inhibiting the generation of particles from the wafer placement surface, which directly faces the rear surface at least when the wafer W is placed, it is possible to reduce metal contamination on the rear surface of the wafer W in the plasma processing.

When the coating film C is formed only on the wafer placement surface of the stage 40 as illustrated in FIG. 8, in addition to reducing metal contamination on the rear surface of the wafer W, the in-plane uniformity of the plasma processing on the wafer W can be further improved.

Specifically, when the coating film C is formed on the surface of the stage 40 exposed to the plasma atmosphere of the processing space S, O* supplied to the processing space S becomes difficult to deactivate compared with the case in which the surface is aluminum. Normally, the plasma processing in the central portion of the wafer W proceeds faster than the plasma processing in the outer peripheral portion. However, by forming the coating film C on the wafer placement surface of the stage 40, the deactivation rate of O* in the central portion of the wafer W becomes smaller than the deactivation rate of O* in the outer peripheral portion. Since O* normally acts to inhibit plasma processing, by reducing the deactivation rate of O* in the central portion of the wafer W to suppress the plasma processing rate as described above, it becomes possible to balance the plasma processing rate in the central portion of the wafer W with the plasma processing rate in the outer peripheral portion of the wafer W. That is, it is possible to inhibit the occurrence of a deviation in plasma processing rate between the central portion and the outer peripheral portion of the wafer W. As a result, it is possible to improve the in-plane uniformity of the plasma processing.

When the lifting pins 61 are made of a metal such as aluminum, radicals may act on the lifting pins 61, and as a result, particles may be generated and metal contamination on the rear surface of the wafer W may occur. Therefore, when the lifting pins 61 are made of a metal, in addition to or instead of the formation of the coating film as described above, the lifting pins 61 may be made of a member having radical resistance. As a material of the lifting pins 61, for example, nickel (Ni), ceramic, Teflon (registered trademark), or the like may be selected.

In the above-described embodiments, the case in which the wafer W is raised and lowered with the operation of the lifter 60 as the lifting mechanism, more specifically, the lifting pins 61, to change the Vdc value in the wafer W has been described as an example, but the configuration of the lifter 60 is not limited thereto, as described above. That is, any configuration can be taken as long as particles adhering to the rear surface of the wafer W can be separated by electrically insulating the wafer W, which is being subjected to the plasma processing, from the stage 40.

In the plasma processing in the above-described embodiments, the $NF_3$ gas, the $O_2$ gas and the Ar gas are supplied as the processing gases, but an Ar gas may be additionally supplied as an additional gas.

According to the above-described embodiments, the $NF_3$ gas is selected as a fluorine-containing gas included in the processing gases, but the type of the fluorine-containing gas is not limited thereto, and, for example, a $SF_6$ gas or a $F_2$ gas may be selected. In addition, the type of the diluting gas is not limited to the Ar gas, and any gas including at least one of a $H_2$ gas and a noble gas may be selected.

The plasma source in the plasma generation space G is not limited to inductively coupled plasma as in the above-described embodiments, and may have an arbitrary configuration such as microwave plasma. However, as described above, the Vdc value in the wafer W is changed with the operation of the lifting pins 61 to change the charged state of the wafer W. Therefore, regardless of which plasma source is adopted, it is desirable for the plasma processing apparatus 1 to include a configuration in which the plasma generation space G and the processing space S are partitioned by the partition plate 11.

According to the present disclosure, metal contamination on the rear surface of a substrate in plasma processing can be appropriately reduced.

It should be understood that the above-described embodiments disclosed herein are exemplary in all respects and are not restrictive. The above-described embodiments may be omitted, replaced, or modified in various forms without departing from the scope and spirit of the appended claims.

What is claimed is:

1. A method of processing a substrate using a substrate processing apparatus,
   wherein the substrate processing apparatus includes:
   a processing container configured to process the substrate therein;
   a plasma generation space formed inside the processing container;
   a processing space in communication with the plasma generation space via a partition plate;
   a stage provided inside the processing space and configured to place the substrate on a top surface of the stage; and
   a lifting mechanism configured to raise and lower the substrate on the stage,
   the method comprising:
   during a plasma processing on the substrate in the processing space, raising and lowering the substrate using the lifting mechanism to cause a potential change in the substrate during the plasma processing,
   wherein the plasma processing is started in a state in which the substrate is separated from the stage by the lifting mechanism, and wherein the substrate starts to be lowered by the lifting mechanism when the plasma processing is started.

2. The method of claim 1, wherein the substrate is lowered by the lifting mechanism during the plasma processing so that the substrate is placed on the stage.

3. The method of claim 1, wherein the lifting mechanism is a lifting pin configured to hold the substrate when the substrate is loaded into or unloaded from the substrate processing apparatus.

4. The method of claim 3, wherein at least a substrate holding surface of the stage is coated with a coating material that has a radical resistance higher than a radical resistance of a metal material of the stage.

5. The method of claim 4, wherein the lifting mechanism is further coated with the coating material.

6. The method of claim 5, wherein the coating material is at least one selected from a group consisting of YF3 and YOF.

7. The method of claim 6, wherein the lifting mechanism includes a constituent member that has a radical resistance higher than a radical resistance of at least a metal material of the stage.

8. The method of claim 1, wherein the lifting mechanism is a lifting pin configured to hold the substrate when the substrate is loaded into or unloaded from the substrate processing apparatus.

9. The method of claim 1, wherein at least a substrate holding surface of the stage is coated with a coating material that has a radical resistance higher than a radical resistance of a metal material of the stage.

10. The method of claim 1, wherein the lifting mechanism includes a constituent member that has a radical resistance higher than a radical resistance of at least a metal material of the stage.

11. A substrate processing apparatus for processing a substrate inside a processing container, comprising:
    a plasma generation space formed inside the processing container;
    a processing space in communication with the plasma generation space via a partition plate;
    a stage provided inside the processing space and configured to place the substrate on a top surface of the stage;
    a lifting mechanism configured to raise and lower the substrate on the stage; and
    a controller configured to control an operation of the lifting mechanism,
        wherein, during a plasma processing on the substrate in the processing space, the controller is configured to control the lifting mechanism to raise and lower the substrate to cause a potential change in the substrate which is being subjected to the plasma processing,
        wherein the plasma processing is started in a state in which the substrate is separated from the stage by the lifting mechanism, and
        wherein the substrate starts to be lowered by the lifting mechanism when the plasma processing is started.

12. The substrate processing apparatus of claim 11, wherein the controller is configured to control the operation of the lifting mechanism such that, during the plasma processing, the substrate is placed on the stage by the lifting mechanism.

13. The substrate processing apparatus of claim 12, wherein at least a substrate holding surface of the stage is coated with a coating material that has a radical resistance higher than a radical resistance of a metal material of the stage.

14. The substrate processing apparatus of claim 13, wherein the lifting mechanism is coated with the coating material.

15. The substrate processing apparatus of claim 14, wherein the coating material is at least one selected from a group consisting of YF3 and YOF.

16. The substrate processing apparatus of claim 15, wherein the lifting mechanism includes a constituent member that has a radical resistance higher than a radical resistance of at least a metal material of the stage.

17. The substrate processing apparatus of claim 11, wherein the lifting mechanism is a lifting pin configured to hold the substrate when the substrate is loaded into or unloaded from the substrate processing apparatus.

* * * * *